(12) United States Patent
Tourret

(10) Patent No.: US 12,405,628 B2
(45) Date of Patent: Sep. 2, 2025

(54) CLOCK CONTROL IN A SYSTEM ON A CHIP (SoC)

(71) Applicant: NXP B.V., Eindhoven (NL)

(72) Inventor: Jean-Robert Tourret, Cormelles le Royal (FR)

(73) Assignee: NXP B.V., Eindhoven (NL)

( * ) Notice: Subject to any disclaimer, the term of this patent is extended or adjusted under 35 U.S.C. 154(b) by 36 days.

(21) Appl. No.: 18/484,997

(22) Filed: Oct. 11, 2023

(65) Prior Publication Data

US 2024/0126320 A1 Apr. 18, 2024

(30) Foreign Application Priority Data

Oct. 18, 2022 (EP) ..................................... 22306574

(51) Int. Cl.
| | |
|---|---|
| *G06F 1/06* | (2006.01) |
| *H03K 3/037* | (2006.01) |
| *H03K 5/00* | (2006.01) |
| *H03K 5/13* | (2014.01) |
| *H03K 5/1534* | (2006.01) |

(52) U.S. Cl.
CPC .............. *G06F 1/06* (2013.01); *H03K 3/037* (2013.01); *H03K 5/00006* (2013.01); *H03K 5/13* (2013.01); *H03K 5/1534* (2013.01); *H03K 2005/00058* (2013.01)

(58) Field of Classification Search
CPC .. G06F 1/06; G06F 1/24; H03K 3/037; H03K 5/00006; H03K 5/13; H03K 5/1534; H03K 2005/00058
See application file for complete search history.

(56) References Cited

U.S. PATENT DOCUMENTS

| | | | |
|---|---|---|---|
| 5,731,715 A | 3/1998 | Mote, Jr. | |
| 2005/0144497 A1* | 6/2005 | Song | G06F 1/10 |
| | | | 713/503 |
| 2013/0147529 A1* | 6/2013 | Ganesan | H03L 7/1803 |
| | | | 327/156 |
| 2016/0041579 A1* | 2/2016 | Ali | H04B 15/00 |
| | | | 713/400 |

(Continued)

OTHER PUBLICATIONS

Senger, Robert M. et al., "Low-Latency, HDL-Synthesizable Dynamic Clock Frequency Controller with Self-Referenced Hybrid Clocking", 2006 IEEE International Symposium on Circuits and Systems, May 21, 2006, pp. 775-778, IEEE, Piscataway, NJ, USA.

*Primary Examiner* — Ryan Jager

(57) ABSTRACT

A plurality of chained clock dividers provides a plurality of generated clocks generated from a root clock. Each clock divider provides a generated clock having a lower frequency that its corresponding input clock and which transitions at falling edges of its corresponding input clock. Clock gating circuitry selectively gates the generated clocks based on a clock ready signal and provides the generated clocks as a corresponding plurality of safe clocks when the clock ready indicator indicates the generated clocks are ready. A delay circuit has an inverted clock input configured to receive a final generated clock. The delay circuit provides a trigger output in response to a falling edge of the final generated clock. A set of synchronization flip flops receives a clock enable signal and the trigger output and provides the clock ready indicator based on the clock enable signal and the trigger output.

20 Claims, 5 Drawing Sheets

(56) References Cited

U.S. PATENT DOCUMENTS

2016/0182056 A1\* 6/2016 Mumper ............ H03K 19/1737
  327/115
2019/0041946 A1\* 2/2019 Wallichs .................... G06F 1/08
2024/0126320 A1\* 4/2024 Tourret ...................... G06F 1/06

\* cited by examiner

CLOCK CONTROL IN A SYSTEM ON A CHIP (SoC)

CROSS-REFERENCE TO RELATED APPLICATIONS

This application claims the priority under 35 U.S.C. § 119 of application Ser. No. 22/306,574.9, filed on 18 Oct. 2022, the contents of which are incorporated by reference herein.

BACKGROUND

Field

This disclosure relates generally to a System on a Chip (SoC), and more specifically, to clock control within an SoC.

Related Art

Most SoCs have one or more integrated free running oscillators used to clock all or parts of the digital circuits. For many reasons, these clocks have to be turned on or off, depending on the chip activity. Unfortunately, the turning on or off of the clocks can result in clock glitches, such as, for example, when a clock is turned on or off during a clock pulse. Clock glitches can prevent the proper functionality of a circuit. For example, a clock glitch can turn into a bad state stop condition when used to control a state machine. Clock glitches can also cause issues with timing for digital circuitry, such as violations of set-up times. Therefore, a need exists for an improved clock control mechanism in which clocks can be cleanly started or stopped, without glitches.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a clock control circuit is capable of releasing and stopping a clock or multiple downscaled versions of a clock, without glitches based on a pre-defined wakeup or stop decision. This pre-defined wakeup or stop decision can be based on one or more of a variety of different parameters or conditions, such as, for example, a start or stop delay time, a duty cycle estimation, a frequency determination, or an amplitude estimator.

Figure 1:
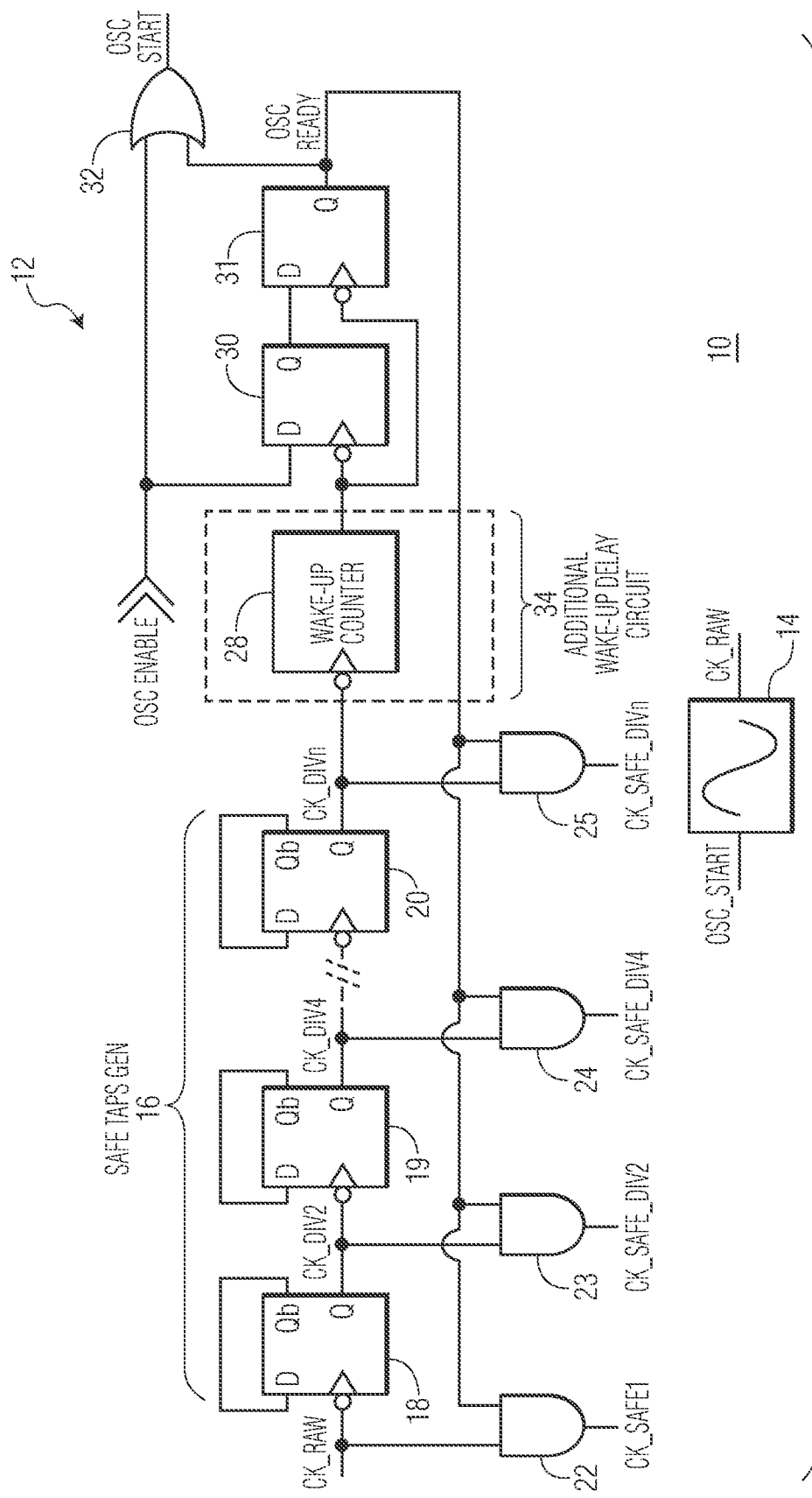
FIG. 1 illustrates, in block diagram form, an SoC with a clock control circuit, in accordance with one embodiment of the present invention.

FIG. 1 illustrates an SoC 10, which maybe implemented as an integrated circuit (IC), having a clock control circuit 12 and an integrated oscillator 14, in accordance with one embodiment of the present invention. Integrated oscillator 14 may be an integrated free running oscillator, but in alternate embodiments, can be an off-chip oscillator or some other clock source. Oscillator 14 receives an oscillator start signal (OSC_START) and generates an oscillator output in response to OSC_START which is provided as a clock signal, referred to as CK_RAW, since this is the clock signal at the output of the oscillator prior to any further processing.

Clock control circuit 12 includes circuitry to control the wakeup (i.e. release) of clocks as well as the stopping of clocks such that no clock glitches occur upon clock releases or stops. Therefore, clock control circuit 12 may also be referred to as a clock wakeup and stop control circuit. As used herein, a clock wakeup or clock release is used to indicate when a clock signal is started and is stable and safe to use by digital circuitry (at which point, it can be "released" for use by the digital circuitry). Clock control circuit 12 includes D flip flops 18-20, AND gates 22-25, an additional wakeup delay circuit 34, which includes a wakeup counter 28, synchronization D flip flops 30 and 31, and OR gate 32. Each of the D flip flops includes a data input D, a data output Q, and a clock input indicated by the triangle. A D flip flop may also include an inverse data output Qb, in which Qb is the inverse of Q (and therefore, Q may be referred to as the true data output, while Qb is the inverse data output). The D flip flops (which may also be referred to simply as flip flops) can be implemented as known in the art, and operate as known in the art, such that, upon receiving the active edge of a clock (which can be the rising or falling edge of the clock), the value at D is output as Q (i.e. Q=D and Qb=Db).

Flip flops 18-20 include N chained flip flops (i.e. also referred to as N chained clock dividers), depending on the number of clock taps needed from the input clock signal, in which N can be any number greater than or equal to two. The inverted output Qb of each flip flop is provided to the data input of the flip flop. Each clock input has a circle indicating an inverted clock input such that the falling edge of the received clock at the inverted clock input is defined as the active edge of the flip fop. Flip flop 18 is a first (i.e. initial) flip flop of the chain and receives CK_RAW from oscillator 14 at its inverted clock input. In this manner, flip flop 18 operates in accordance with the falling edges of CK_RAW such that, upon a falling edge of CK_RAW, the value at the D input is provided as the Q output. Also upon the falling edge of CK_RAW, the inverse of the value of D (Db) is provided as the Qb output. The Qb output is connected to the D input such that the Q output of flip flop 18 produces a clock, CK_DIV2, whose frequency is half of that of its input clock, CK_RAW (i.e. CK_DIV2 is CK_RAW divided by two). As will be seen in reference to FIG. 2 below, CK_DIV2 toggles at every falling edge of CK_RAW.

Flip flops 19 and 20 are connected in a similar manner. For example, an inverted clock input of flip flop 19 is coupled to the Q output of flip flop 18 to receive CK_DIV2, such that, upon a falling edge of CK_DIV2, the value at the D input is provided as the Q output and the inverse is provided at the Qb output. The Qb output is connected to the D input such that the Q output of flip flop 19 produces a clock, CK_DIV4, whose frequency is half of that of its input clock, CK_DIV2 (which corresponds to one-fourth the frequency of CK_RAW, i.e. CK_DIV4 is CK_RAW divided by four). Flip flop 20 is the last flip flop of the N flip flops, in which the inverted clock input of flip flop 20 receives the clock output from the previous flip flop, and the Q output produces a clock, CK_DIVn, whose frequency is half of its input clock (i.e. CK_DIVn is CK_RAW divided by $2^N$).

In the illustrated embodiment, each D flip flop of the chain of N flip flops generates a divided clock with half the frequency of its input clock, and may therefore also be referred to as a clock divider. Note that CK_RAW may be referred to as the root clock from which the N flip flops generate additional clocks at various frequencies based on the frequency of the root clock. Also, in alternate embodiments, CK_RAW can be received from any clock source, integrated in SoC 10 or external to SoC 10. Note also that each output clock of a flip flop of the chain of N flip flops toggles with the falling edge rather than the rising edge of its input clock such that any transition of a divided clock corresponds to an already reached low state of its corresponding received input clock. In alternate embodiments, each clock divider may be implemented with different circuitry with different clock divisors other than two or powers of two to generate the divided clocks, in which the toggling of the divided clock (i.e. the edges of the divided clock) occurs with falling edges but not rising edges of its input clock such that any transition of the divided clock corresponds to the already reached low state of its input clock.

Clock control circuit 12 also includes AND gates 22-25 to produce safe clocks corresponding to CK_RAW and each of the clocks produced by the chain of N flip flops. A safe clock is a stable clock without glitches that is released from clock control circuitry 12 in response to enabling oscillator 14 (i.e. in response to assertion of OSC_ENABLE). A first input of AND gate 22 is coupled to receive CK_RAW, and a first input of each of AND gates 23-25 is coupled to receive a corresponding output of a flip flop in the chain of N flip flops. A second input of each of AND gates 22-25 is coupled to receive an oscillator read signal (OSC_READY). Therefore, AND gate 22 is coupled to receive CK_RAW and OSC_READY as inputs, and provides a safe clock, CK_SAFE1, corresponding to a safe version of CK_RAW. AND gate 23 is coupled to receive CK_DIV2 and OSC_READY as inputs, and provides a safe clock, CK_SAFE2, corresponding to a safe version of CK_DIV2. AND gate 24 is coupled to receive CK_DIV4 and OSC_READY as inputs, and provides a safe clock, CK_SAFE4, corresponding to a safe version of CK_DIV4. AND gate 25 is coupled to receive CK_DIVn and OSC_READY as inputs, and provides a safe clock, CK_DIVn, corresponding to a safe version of CK_DIVn.

The chain of N flip flops along with the corresponding AND gates 22-25 may be referred to as a safe taps generator 16 since this circuitry produces safe clocks tapped from CK_RAW, including CK_SAFE1 CK_SAFE_DIVn. The number of taps generated from the root clock depends on the value of N. Note that the safe versions of the clocks are only released when the oscillator has been enabled (after assertion of OSC_ENABLE) and the oscillator is ready (after assertion of OSC_READY), otherwise, the safe versions of the clocks generated from CK_RAW by the chain of N flip flops is held off at zero (i.e. gated) by the corresponding AND gates. As will be described in more detail below, assertion of OSC_READY indicates that CK_RAW and the clocks tapped from CK_RAW are stable and ready for use.

Clock control circuit 12 includes additional wakeup delay circuit 34 which receives the output clock, CK_DIVn, from the last flip flop in the chain of N flip flops and synchronization flip flops 30 and 31 coupled to receive an output of additional wakeup delay circuit 34 as well as the OSC_ENABLE signal. The oscillator enable signal can be generated by any circuitry within SoC 10 which requires enabling oscillator 14 to generate CK_RAW. Synchronization flip flops 30 and 31 each have a clock input coupled to receive the output of additional wakeup delay circuit 34. In this example, the clock inputs of the synchronization flip flops are not inverted (there is no circle at these inputs), such that the rising edge of the received clock at the clock input is defined as the active edge of the flip flop. Additional wakeup delay circuit 34 adds a wakeup delay to CK_DIVn such that a rising edge of CK_DIVn takes the delay time to propagate to the clock inputs of flip flops 30 and 31. A D input of flip flop 30 is coupled to receive OSC_ENABLE, the Q output of flip flop 30 is coupled to a D input of flip flop 31, and a Q output of flip flop 31 provides OSC_READY. A first input of OR Gate 32 is coupled to receive OSC_ENABLE, a second input of OR gate 32 is coupled to receive OSC_READY, and an output of OR gate 32 provides OSC_START to oscillator 14. Synchronization flip flops 30 and 31 are used to synchronize OSC_ENABLE. Note that in alternate embodiments more chained synchronization flip flops may be used, while in other embodiments, a single synchronization flip flop is used. In any of these embodiments, the output of additional wakeup delay circuit 34 is provided to the clock inputs of these one or more chained synchronization flip flops, with the first one receiving OSC_ENABLE at its D input and the final one providing OSC_READY. Note that any of the one or more flip flops implemented in the chain of synchronization flip flops can be generally referred to as a synchronization flips flop or synchronization circuitry.

Figure 3:
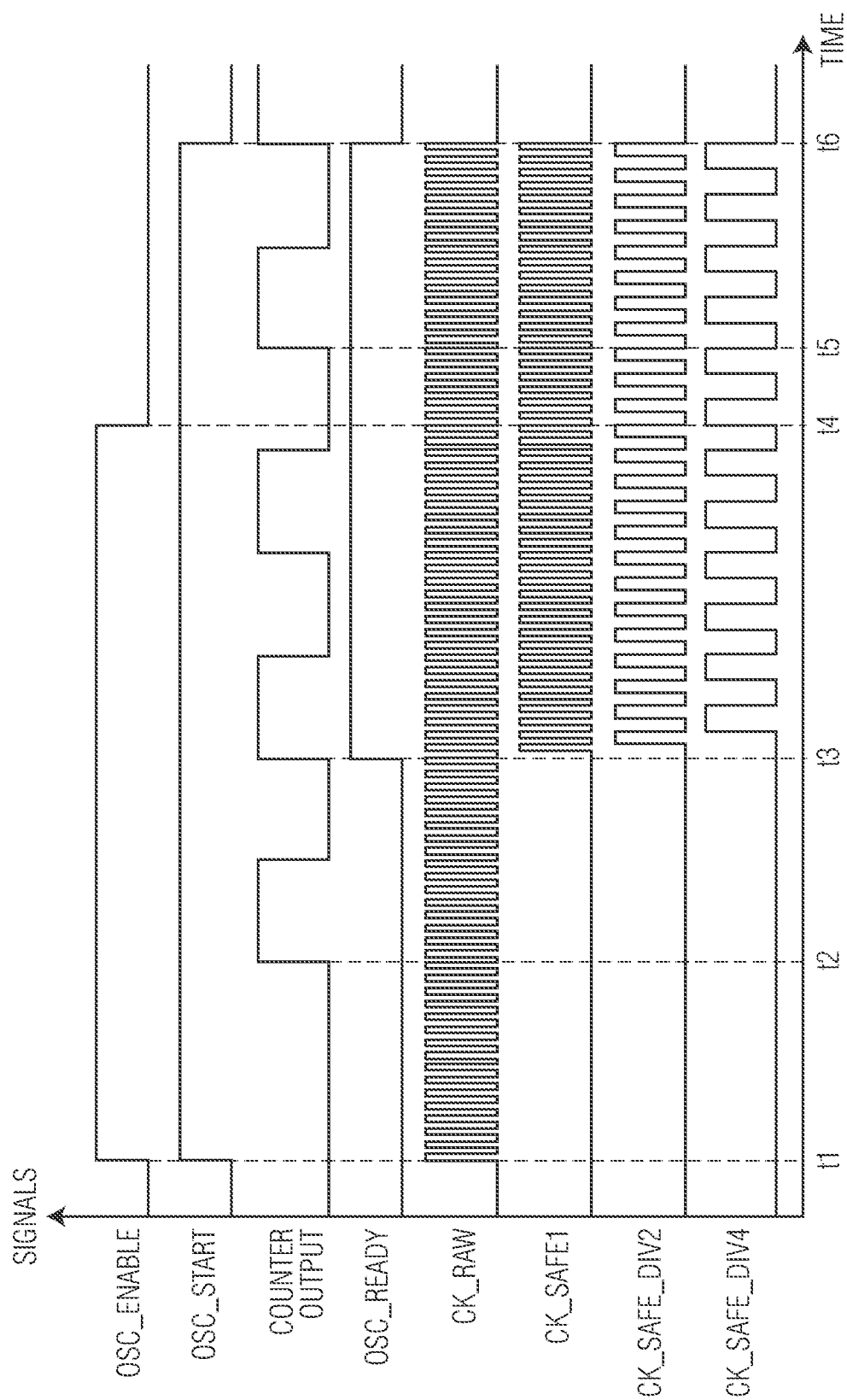
FIG. 3 illustrates, in timing diagram form, various waveforms of signals within the SoC of FIG. 1, in accordance with one embodiment of the present invention.

In the illustrated embodiment, additional wakeup delay circuit 34 includes a wakeup counter 28 which provides the delay time. In one embodiment, an inverted clock input of wakeup counter 28 receives CK_DIVn such that falling edges (rather than rising edges) of CK_DIVn are counted. Wakeup counter 28 is set to count a value Y, in which wakeup counter 28 does not assert its output until Y falling edges of CK_DIVn have been counted, at which point, a rising edge is provided at the clock inputs of the synchronization flip flops. (Note that either a counter which counts up to Y or a counter which counts down from Y may be used.) In one embodiment, the output of wakeup counter 28 generates a rising edge each time Y falling edges of CK_DIVn are counted, in which a reset (transition back to zero) occurs between the rising edges. The OSC_ENABLE signal is therefore sampled at each rising edge of the output of wakeup counter 28. Note that since the rising edge of the output of wakeup counter 28 triggers sampling the OSC_ENABLE signal, the counter output may be referred to as a trigger output. In one embodiment, counter 28 is a synchronous counter in which the output is valid for one cycle of the input clock (CK_DIVn) and returns to zero. In another embodiment (as illustrated in FIG. 3 described below), an asynchronous clock may be used. For example, with an asynchronous clock, the return to zero occurs half way between the rising edges such that the output of wakeup counter 28 can be described as providing a clock signal which is CK_DIVn divided by Y (e.g. CK_DIVn_DIVY). Counter 28 can be implemented with any known counter or combination of circuitry. For example, in one embodiment, it may be implemented as another chain of clock dividers.

In operation, once OSC_ENABLE is asserted (e.g. to a logic level one), OSC_START is asserted as well. This starts oscillator 14 which provides CK_RAW. CK_RAW is propagated through the chain of N flips flops, resulting in CK_DIVn. Once wakeup counter 28 counts Y falling edges of CK_DIVn (corresponding to Y pulses of CK_DIVn), synchronization flip flops 30 and 31 are clocked so as to latch (and propagate) the asserted OSC_ENABLE into flops 30 and 31, resulting in asserting OSC_READY (e.g. to a logic level one) at the output of flip flop 31. With OSC_READY asserted, OSC_START remains asserted and each of AND gates 22-25 stops gating the clock signals, thus allowing CK_RAW, CK_DIV2, CK_DIV4, CK_DIVn to propagate out through the corresponding AND gates as safe glitchless clocks CK_SAFE1, CK_SAFE2, CK_SAFE4, and CK_SAFE_DIVn, respectively. Note that OSC_READY can be referred to as a clock gating signal which controls when the safe clocks are gated or not. The released safe clocks are glitchless because the use of the inverted clock inputs by the chain of N flip flops, the additional wakeup delay circuit, and the synchronization flip flops ensure that OSC_READY is only asserted to release the clocks when all clocks are at zero, as will be seen with respect to FIG. 2 below. The same applies for disabling the clocks. In this manner, the clocks cannot be released or stopped at improper times during a clock cycle of the root clock or any of the clocks generated from the root clock.

Note that in alternate embodiments, different implementations of wakeup counter 28 can be used. For example, the wakeup counter can countdown from Y or count up to Y to assert its output. Also, in the illustrated embodiment, AND gates (22-25) are used to gate the clocks from being released such that the safe clocks are off at zero until they are released.

Therefore, AND gates 22-25 may be referred to collectively as a clock gating circuit. Alternatively, other logic circuitry can be used to implement the clock gating circuit to perform the gating.

Figure 2:
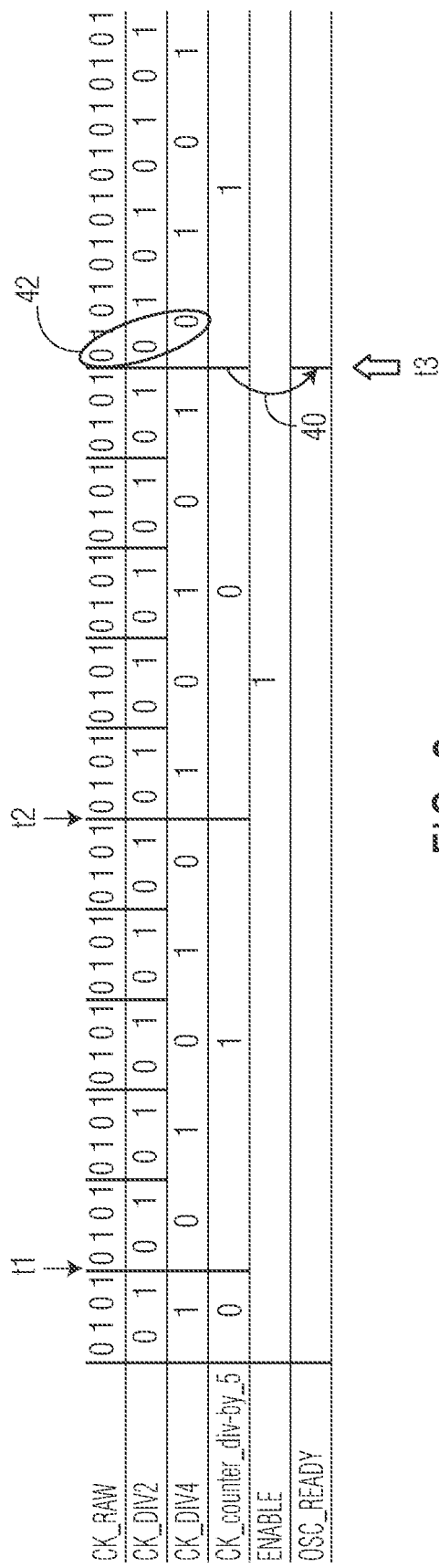
FIG. 2 illustrates, in table form, various signal values within the SoC of FIG. 1, in accordance with one embodiment of the present invention.

FIG. 2 illustrates, in diagrammatic form, a table of signals from FIG. 1 to better understand operation of FIG. 1. In the example of FIG. 2, it is assumed that flip flops 18-20 include a chain of two flip flops, producing CK_DIV2 and CK_DIV4. In this case, CK_DIV4 is provided to the inverted clock input of wakeup counter 28. Also in this embodiment, the count value Y is set to 5. In one embodiment, note that the output of wakeup counter 28 can be described as providing a CK_DIV4 divided by Y (i.e. CK_counter_div_by_5 in this example).

The top row of the table correspond to CK_RAW which toggles between 0 and 1 at a frequency of CK_RAW. In the case that CK_RAW is the output of oscillator 14, the frequency of CK_RAW is the frequency of the output of the oscillator. The second row corresponds to CK_DIV2 which toggles between 0 and 1 at every falling edge (1 to 0) transition of CK_RAW, resulting in half the frequency of CK_RAW. The third row corresponds to CK_DIV4 which toggles between 0 and 1 at every falling edge (1 to 0) transition of CK_DIV2 (or every other falling edge of CK_RAW), resulting in one fourth the frequency of CK_RAW. For example, at time t1, when CK_RAW has a falling edge from 1 to 0, CK_DIV2 has a falling from 1 to 0, and CK_DIV4 also has a falling edge from 1 to 0.

Prior to time t1, it is assumed that CK_counter_div_by_5 is at 0 and wakeup counter 28 is reset. It is also assumed that OSC_ENABLE was previously asserted which resulted in starting oscillator 14 and thus CK_RAW. At time t1, the falling edge of CK_DIV4 triggers wakeup counter 28 to start counting the falling edges. Time t3 corresponds to the $5^{th}$ falling edge of CK_DIV4, therefore, the output of counter 28 is asserted (as indicated by the rising edge of CK_counter_div_5 at time t3). Assuming only one synchronization flip flop, in response to the assertion of the output of counter 28, the synchronization flip flop samples the asserted OSC_ENABLE, resulting in assertion of OSC_READY (to a logic level one). Time t2 corresponds to the middle of the clock cycle generated by CK_counter_div_by_5. Due to the use of the flip flop chain to produce the divided clocks in which inverted clock inputs are used in each of the flip flops, the assertion of OSC_READY (which releases the safe clocks) always occurs when all non-inverted clocks (CK_RAW, CK_DIV2, and CK_DIV4) are in their low phase, and is synchronized to the falling edge output by the last flip flop (CK_DIV4 in this example). This is seen in section 42 of the table in which, when OSC_READY is asserted at time t3, all clocks have reached their "low" state (e.g. 0).

FIG. 3 illustrates, in timing diagram form, waveforms of various signals of FIG. 1 in accordance with another embodiment of the present invention, still assuming the use of 2 flip flops (e.g. 18-19), in which CK_DIV4 is provided to the inverted clock input of wakeup counter 28. In this example, the Y value of the counter is set to four, and the output of counter 28 is labeled as counter output (but may also be referred to as the trigger output). At time t1, OSC_ENABLE is asserted, thus OSC_START is also asserted. In response to assertion of OSC_START, CK_RAW is generated by oscillator 14. With CK_RAW running, flip flop 18 outputs CK_DIV2 and flip flop 19 outputs CK_DIV4. These clocks are not illustrated in FIG. 3, instead, the gated clocks, CK_SAFE1, CK_SAFE_DIV2, and CK_SAFE_DIV4, are illustrated which are still all off at zero since OSC_READY is still at zero. At time t2, a fourth falling edge of CK_DIV4 is received at the inverted clock input of counter 28, resulting in the output of counter 28 going high to a logic level one. This rising edge triggers flip flops 30 and 31, in which flip flop 30 samples OSC_ENABLE. Since OSC_ENABLE is a one, flip flop 30 latches a one for OSC_ENABLE.

At time t3, the next fourth falling edge of CK_DIV4 is received, resulting in another rising edge at the output of the counter. At this time, the value in flip flop 30 propagates to flip flop 31, resulting in OSC_READY being asserted to a logic level one. This results in starting all the safe clocks via AND gates 22-23, as illustrated by CK_SAFE1, CK_SAFE_DIV2, and CK_SAFE_DIV4 being released at time t3. Note that at the point in time when these clocks are released, they are each in their low state (each at zero), as was also described above in reference to FIG. 2. This ensures that no glitches appear on any of the safe clocks upon releasing the clocks.

Between times t3 and t4, SoC 10 is in normal operation for any amount of time until, at time t4, OSC_ENABLE is negated indicating the need to turn off the clocks. Since OSC_START is the ORing of OSC_READY and OSC_ENABLE, it remains at one since OSC_READY is still at one. Note that at each rising edge of the counter output, OSC_ENABLE is sampled by flip flop 30. Between times t3 and t4, OSC_ENABLE would always be sampled as one since it is not negated until time t4. At time t5, the counter output is again asserted, which corresponds to the $4^{th}$ falling edge of CK_DIV4 after the immediately preceding rising edge the counter output. In response to this rising edge of the counter output, OSC_ENABLE is sampled as a zero, therefore, flip flop 30 latches this zero value. Upon the subsequent rising edge of the counter output (which occurs upon the subsequent $4^{th}$ falling edge of CK_DIV4), the value of zero propagates to flip flop 31, resulting in the negation of OSC_READY (and thus also OSC_START). With the negation of OSC_READY, the clock signals are again gated by the AND gates such that all the safe clocks are again provided as zero. Again, note that upon gating of the safe clocks (i.e. upon turning off the safe clocks), all of the clocks are already in their low state (at zero), preventing any glitches on any of the safe clocks upon stopping the clocks.

Note that the waveforms of FIG. 3 only provide an example of the possible timing of some of the signals. Some may differ depending, for example, on initializing values or implementations. At a minimum, the clocks should be released or stopped when at the zero (or low) state so as to prevent any glitches on the released or stopped safe clocks. However, the selected implementation of counter 28 or of the initialization values for the chain of N flip flops generating the clock signals may slightly alter some of the timing of FIG. 2. For example, in the illustrated embodiment, a rising edge at the counter output (at which OSC_ENABLE is first sampled) does not occur until Y falling edges of CK_DIV4 (e.g. Y=4 in FIG. 2) after starting the clocks, and then, due to the use of two synchronization flip flops, OSC_READY is not asserted until after 8 falling edges of CK_DIV4. Therefore, in FIG. 3, OSC_READY is not asserted until time t3. In this example, it was assumed that all flip flops of the chain of N flips were initialized to zero. However, one or more of the flip flops of the chain of N flips can be initialized to a one rather than zero, to shorten the amount of time until the rising edge of the counter output at which OSC_ENABLE is first sampled. For example, such an initialization may result in only requiring fewer (e.g. Y/2) falling edges of CK_DIV4 to first assert the counter output. In this example, OSC ready would be asserted before time t3. Regardless, though, due to the timing of the clocks generated from CK_RAW in which each clock is provided to an inverted clock input of a subsequent flip flop in the chain of N flip flops, any rising edge of the counter output at which OSC_ENABLE is sampled occurs coincident with falling edges of CK_RAW or of any of the clocks generated from CK_RAW.

Figure 4:
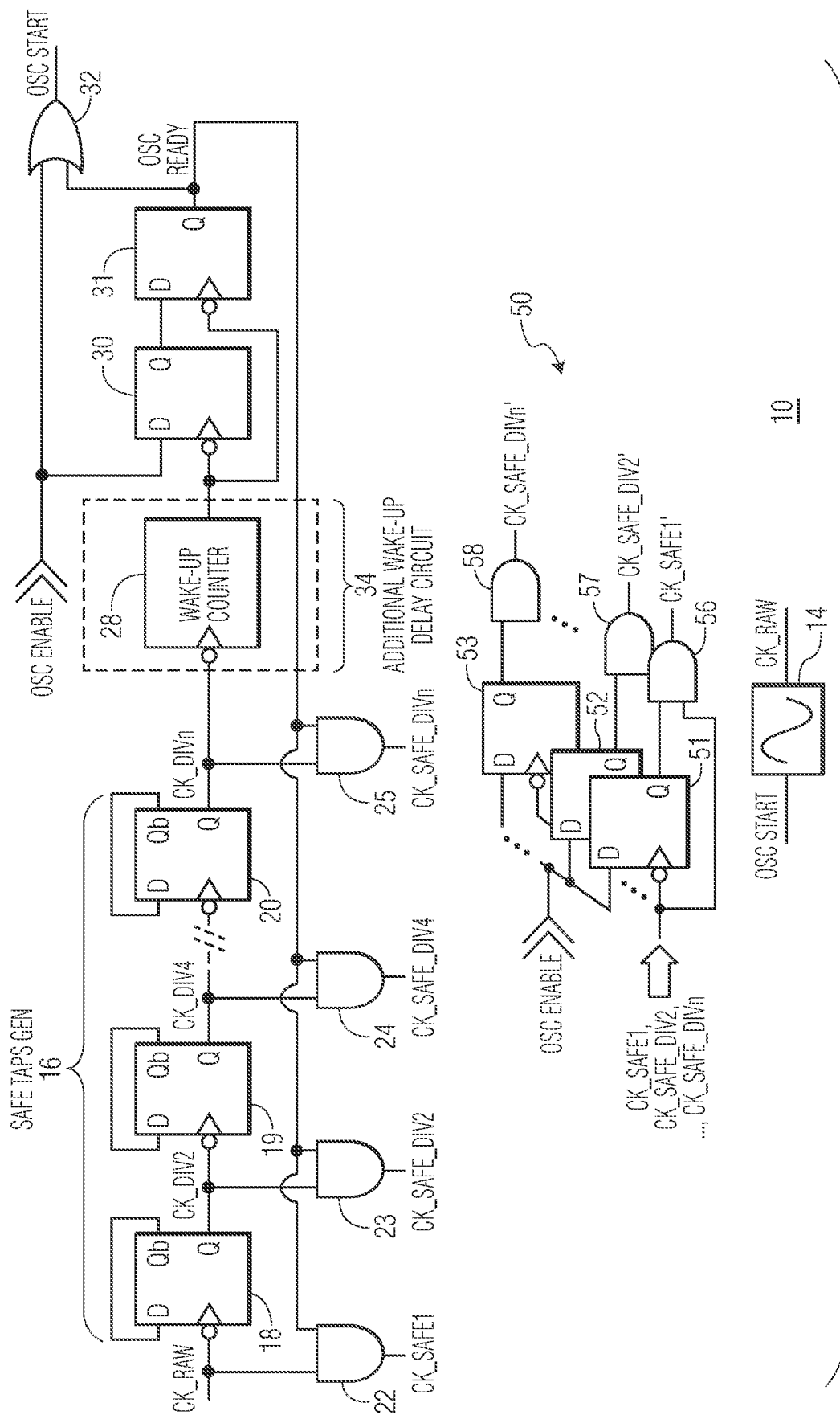
FIG. 4 illustrates, in block diagram form, the SoC of FIG. 1 with additional control circuitry, in accordance with one embodiment of the present invention.

FIG. 4 illustrates SoC 10 in accordance with another embodiment of the present invention which further includes circuit 50. In the embodiments described above, the stop time is done in a symmetrical manner as the start times (i.e. wakeup times). However, sometimes it may be desired to stop a clock as soon as possible. Therefore, circuit 50 may be used to immediately stop the clocks after each of their own cycles when OSC_ENABLE has been deasserted. Circuit 50 includes N+1 flip flops 51-53, each receiving a corresponding safe clock output of safe taps generator 16 (e.g. CK_SAFE1, CK_SAFE_DIV2, CK_SAFE_DIV4, CK_SAFE_DIVn), and N+1 AND gates 56-57. Each flip flop receives the OSC_ENABLE at its D input, and receives the corresponding safe clock at its inverted clock input. The Q output of each flip flop is provided to a first input of a corresponding AND gate. These corresponding AND gates 56-57 therefore provide corresponding safe clocks (e.g. CK_SAFE1', CK_SAFE_DIV2', CK_SAFE_DIV4', CK_SAFE_DIVW) but with a more immediate stop time as compared to the safe clocks (e.g. CK_SAFE1, CK_SAFE_DIV2, CK_SAFE_DIV4, CK_SAFE_DIVn) at the outputs of AND gates 22-25.

As an example, flip flop 51 receives corresponding safe clock CK_SAFE1 at its inverted clock input such that, when OSC_ENABLE is asserted, its Q output is provided to a first input of corresponding AND gate 56. The corresponding safe clock CK_SAFE1 is also provided to a second input of the AND gate 56. Therefore, while OSC_ENABLE remains asserted, such as between times t3 to t4 of FIG. 3, CK_SAFE1' matches CK_SAFE1. However, when OSC_ENABLE is negated, at the next falling edge of CK_SAFE1, the Q output of flip flop 51 goes low, turning off CK_SAFE1' at the output of AND gate 56. In this situation, referring again to FIG. 3, while CK_SAFE1 is not stopped until OSC_ENABLE is propagated through the synchronization flip flops, resulting in the negation of OSC_READY, CK_SAFE1' is stopped almost immediately when OSC_ENABLE is asserted. Therefore, in FIG. 3, CK_SAFE1' would be stopped (turned off at zero) at time 4 rather than time t6. Since the Q output of flip flop 51 is synchronized to the falling edge of its input clock (e.g. falling edge of CK_SAFE1), CK_SAFE1' is also ensured to stop when its corresponding input clock is at zero, preventing any glitches in CK_SAFE1'. Note that analogous descriptions apply to each of flip flops 51-53 and gates 56-57.

Figure 5:
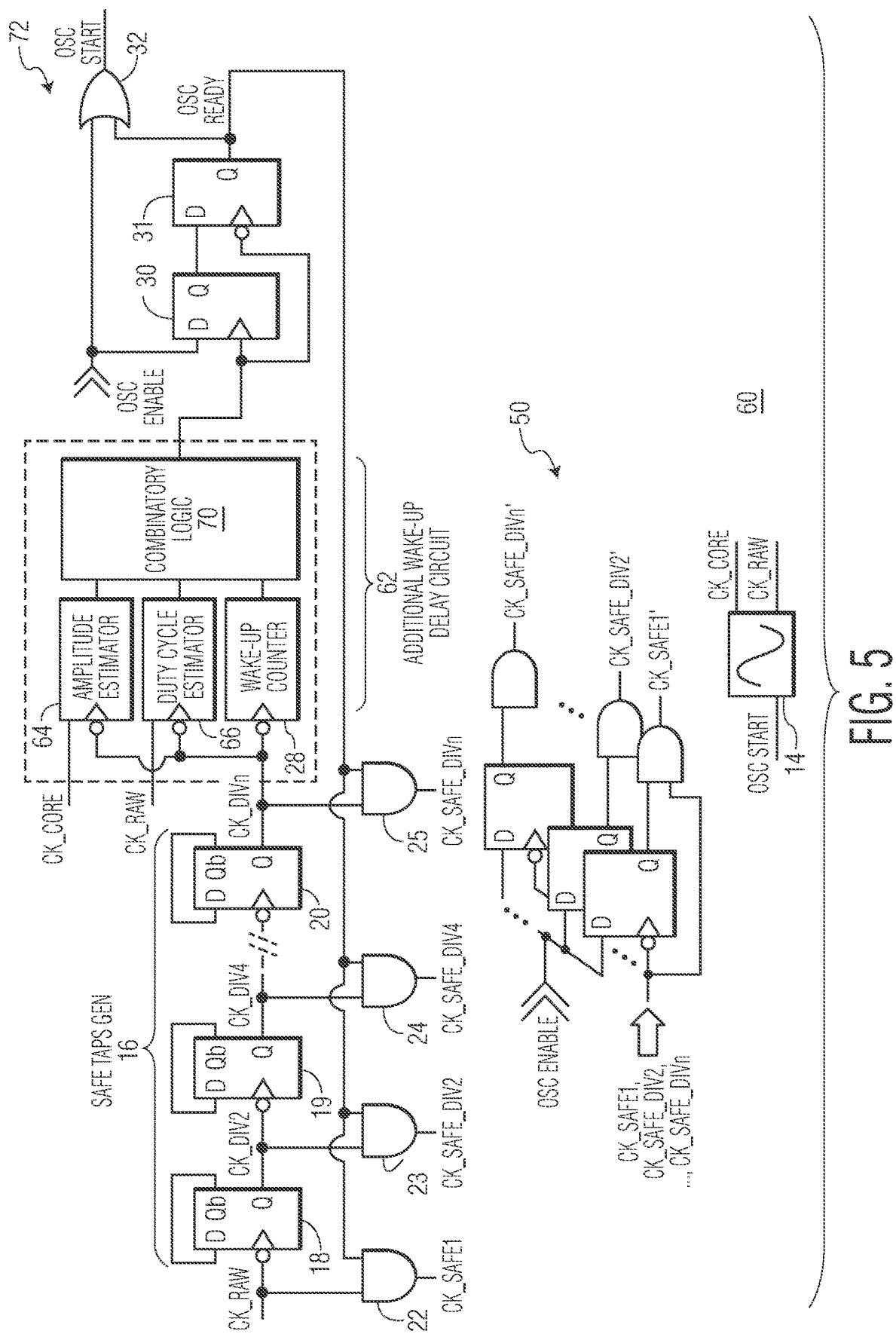
FIG. 5 illustrates, in block diagram form, an SoC with a clock control circuit, in accordance with one embodiment of the present invention.

FIG. 5 illustrates an SoC 60 which includes a clock control circuit 72 similar to clock control circuit 12 of FIG. 1, in accordance with an embodiment of the present invention, in which like numerals indicate like elements. Clock control circuit 72 is the same as clock control circuit 12 except that additional wakeup delay circuit 34 is replaced with additional wakeup delay circuit 62. Additional wakeup delay circuit 62 includes wakeup counter 28 (or can be any counter implementation), a duty cycle estimator circuit 66, an amplitude estimator circuit 64, and combinatory logic 70. Each of wakeup counter 28, duty cycle estimator circuit 66, and amplitude estimator circuit 64 receives the output clock, CK_DIVn, from the last flip flop in the chain of N flip flops at a corresponding inverted clock input. Therefore, similar to counter 28 described above in reference to FIG. 2, each of the circuits 64 and 66 is also triggered by the falling edge of the input clock.

Amplitude estimator circuit 64 receives a core clock, CK_CORE, of SoC 60 and estimates its amplitude. This amplitude estimation is triggered (i.e. initiated) by a falling edge of CK_DIVn, and an output is provided indicating if the estimated amplitude has reached an amplitude threshold. If it has, the output can be asserted high (to a logic level one), and if not, the output remains low (a logic level zero). Duty cycle estimator circuit 66 receives CK_RAW, and estimates its duty cycle. This duty cycle estimation is triggered (i.e. initiated) by a falling edge of CK_DIVn, and an output is provided indicating if the estimated duty cycle has reached a duty cycle threshold. If it has, the output can be asserted high (to a logic level one), and if not, the output remains low (a logic level zero). Therefore, instead of using a counter which counts Y falling edges of CK_DIVn to determine that CK_DIVn is sufficiently stable to wakeup the safe clocks (i.e. assert OSC_READY to release the safe clocks), other method may be used to make this wakeup determination. In one example, an amplitude of CK_CORE is used such that the amplitude has to reach a sufficient level to wakeup the safe clocks. In another example, a duty cycle of CK_RAW is used such that the duty cycle has to reach a sufficient level to wakeup the safe clocks.

In one embodiment, any one of the outputs of amplitude estimator circuit 64, duty cycle estimator 66, or counter 28 can be used to provide a rising edge to the clock input of flip flop 30 to sample OSC_ENABLE and thus initiate the wakeup (i.e. release) of the safe clocks. In this case, one of the outputs of circuits 64, 66, or 28 can be provided to the clock input of flip flop 30, such as with the use of a multiplexer or other selection circuitry. Therefore, in one embodiment, combinatory logic 70 can implement such selection circuitry to provide an input to flip flop 30. In other embodiments, any combination of the outputs of circuits 64, 66, and 28 can be used to provide the input to flip flop 30. For example, an AND function may be implemented in which two or more conditions have to be met to trigger flip flop 30 to sample OSC_ENABLE, in which each of circuits 64, 66, and 38 evaluate and validate a corresponding condition (e.g. amplitude, duty cycle, time, respectively). Alternatively, combinatory logic 70 may be implemented such that a sequence of conditions have to be met to trigger flip flop 30 to sample OSC_ENABLE. For example, combinatory logic 70 may implement a state machine or portion of a state machine used to make the decision of when a wakeup can safely occur. Therefore, similar to the output of counter 28 discussed in reference to FIG. 1, the output of combinatory logic 70 may also be referred to as a trigger output which, when asserted, triggers sampling of OSC_ENABLE.

Any known circuitry may be used to implement amplitude estimator circuit 64 or duty cycle estimator 66 or counter 28. Additional wakeup delay circuit 62 may include all these circuits, or a subset of these circuits, as needed. Alternate embodiments may include other condition determination circuits which may be included in additional wakeup delay circuit 62, in which additional wakeup delay circuit 62 can include any subset or combination of the condition determination circuits. For example, other condition determination circuits may include a frequency counter or any other circuit determining a characteristic which indicates that the clocks can be released or stopped. Also, in alternate embodiments, a different generated clock from the chain of clock dividers (e.g. the chain of N flip flops) can be provided to the inverted clock input(s) of additional wakeup delay circuit 34 or 62, depending on the additional delay provided by the additional wakeup delay circuit.

Therefore, by now it can be understood how a clock control circuit can ensure glitchless clocks upon releasing safe clocks for use by an SoC or stopping the safe clocks. In one embodiment, a chain of N flip flops operates as clock dividers in which each flip flop receives a clock from a clock source or generated from a previous flip flop of the chain at an inverted clock input. Further, through the use of an additional wakeup delay triggered by a falling edge of a last clock generated form the chain of flip flops, sampling of OSC_ENABLE is synchronized to a falling edge of last clock and delayed until wakeup is appropriate. The decision to sample the OSC_ENABLE signal and thus wakeup (assuming the sampled enable signal is at its asserted value), can be made in response to one or more qualifying conditions. These conditions may include a time period which can be determined by a counter which counts falling edges of CK_DIVn, an amplitude, a duty cycle, a frequency, or other characteristic. In this manner, glitches can be avoided, helping ensure proper operation of any circuitry receiving the safe clocks.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a lower case "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. Also for example, in one embodiment, the illustrated elements of SoC 10 and 60 are circuitry located on a single integrated circuit or within a same device. Oscillator 14 can be any clock source provided within the SoC, and is not limited to an oscillator. Alternatively, clock signals from oscillator 14 or other clock sources may be provided from external the SoC.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, other types or combinations of flip flops can be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

A plurality of chained clock dividers provides a plurality of generated clocks generated from a root clock. Each clock divider provides a generated clock having a lower frequency that its corresponding input clock and which transitions at falling edges of its corresponding input clock. Clock gating circuitry selectively gates the generated clocks based on a clock ready signal and provides the generated clocks as a corresponding plurality of safe clocks when the clock ready indicator indicates the generated clocks are ready. A delay circuit has an inverted clock input configured to receive a final generated clock. The delay circuit provides a trigger output in response to a falling edge of the final generated clock. A set of synchronization flip flops receives a clock enable signal and the trigger output and provides the clock ready indicator based on the clock enable signal and the trigger output.

The following are various embodiments of the present invention.

In one embodiment, an integrated circuit includes a plurality of chained clock dividers configured to receive a root clock and configured to provide a plurality of generated clocks generated from the root clock, each clock divider of the plurality of chained clock dividers provides a generated clock of the plurality of generated clocks having a lower frequency that its corresponding input clock and which transitions at falling edges of its corresponding input clock; clock gating circuitry configured to receive the plurality of generated clocks and selectively gate the plurality of generated clocks based on a clock ready signal, wherein the clock gating circuitry is configured to provide the plurality of generated clocks as a corresponding plurality of safe clocks when the clock ready indicator indicates the plurality of generated clocks are ready; a delay circuit having an inverted clock input configured to receive a final generated clock from the plurality of generated clocks and configured to provide a trigger output in response to a falling edge of the final generated clock; and a set of synchronization flip flops configured to receive a clock enable signal and the trigger output from the delay circuit, and configured to provide the clock ready indicator based on the clock enable signal and the trigger output. In one aspect of this embodiment, each clock divider of the plurality of clock dividers comprises a D flip flop, each flip flop having a corresponding D input and corresponding inverse Q output coupled to each other. In a further aspect, each flip flop receives a corresponding input clock at a corresponding inverted clock input and provides a corresponding divided output clock at a corresponding Q output. In another further aspect, each flip flop provides the corresponding divided clock output at half a frequency of the corresponding input clock. In another further aspect, the plurality of chained clock dividers includes a first flip flop having a corresponding inverted clock input configured to receive the root clock and a corresponding Q output configured to provide a first generated clock of the plurality of generated clocks to a corresponding inverted clock input of a subsequent flip flop and to the clock gating circuitry, and a final flip flop having a corresponding inverted clock input configured to receive a corresponding generated clock from a corresponding Q output of a previous flip flop and having a corresponding Q output configured to provide the final generated clock. In another aspect of this embodiment, the delay circuit asserts the trigger output by providing a rising edge at a delay time after the falling edge of the final generated clock. In a further aspect, the delay time is determined based on satisfying one or more conditions selected from a group of conditions consisting of a count of falling edges of the final generated clock, an estimated amplitude of a core clock, an estimated duty cycle of the root clock, a frequency of a selected clock. In yet a further aspect, the delay time is determined based on satisfying a logical combination of at least two conditions. In another further aspect, the delay circuit includes at least one of a counter configured to count falling edges of the final generated clock and assert the trigger output when a predetermined number of falling edges is counted, an amplitude estimator circuit configured to, in response to the falling edge of the final generated clock, estimate an amplitude of a clock signal and assert the trigger output when the amplitude is at least a predetermined threshold amplitude, and a duty cycle estimator circuit configured to, in response to the falling edge of the final generated clock, estimate a duty cycle of the root clock and assert the trigger output when the duty cycle is at least a predetermined threshold duty cycle. In yet another aspect of this embodiment, the set of synchronization flip flops includes a first flip flop configured to receive the clock enable signal at a corresponding data input, a clock input configured to receive the trigger output from the delay circuit, and a corresponding data output, wherein the first flip flop is configured to sample a value of the enable signal in response to a rising edge of the trigger output, wherein the clock ready indicator is asserted to indicate that the plurality of generated clocks are ready in response to sampling an asserted value of the clock enable signal upon receiving a rising edge of the trigger output, and is negated in response to sampling a negated value of the clock enable signal upon receiving the rising edge of the trigger output. In a further aspect, the corresponding data output of the first flip flop is provided as the clock ready indicator. In another further aspect, the set of synchronization flip flops includes a second flip flop having a clock input configured to receive the trigger output from the delay circuit, a corresponding data input coupled to the corresponding data output of the first flip flop, and a corresponding data output is provided as the clock ready indicator. In another aspect, the clock gating circuitry is configured to provide a constant logic level zero as each of the plurality of safe clocks while the clock ready indicator is negated to indicate clocks are not ready. In yet another aspect, the root clock is started when either the clock enable signal is asserted or the clock ready indicator is asserted. In yet another aspect, the integrated circuit further includes a set of flip flops corresponding to each of the plurality of safe clocks, wherein the set of flip flops are configured to provide a constant logic level zero as each of the plurality of safe clocks immediately upon the clock enable signal being negated.

In another embodiment, a method of controlling clocks in an integrated circuit includes starting a root clock; generating a plurality of divided clocks based on the root clock, each having a different frequency, wherein the plurality of divided clocks includes a final divided clock with a lowest frequency of the plurality of divided clocks, and each of the plurality of divided clocks only transitions between high and low states with falling edges but not rising edges of those divided clocks of the plurality of divided clocks having a higher frequency; in response to a falling edge of the final divided clock, initiating a delay time, wherein the delay time is based on at least one of counting a number of falling edges of the final divided clock, estimating an amplitude of a selected clock, and estimating a duty cycle of the root clock; upon completion of the delay time, sampling a clock enable signal; providing a clock ready signal based on the sampled clock enable signal; and using the clock ready signal to selectively gate the plurality of divided clocks. In one aspect, when the sampled clock enable signal indicates that clocks are enabled, the clock ready signal is asserted and the plurality of divided clocks are released as safe clocks upon assertion of the clock ready signal, wherein at a point in time when the plurality of divided clocks are released, each of the plurality of divided clocks are in its corresponding low state, and, when the sampled clock enable signal indicates that clocks are not enabled, the clock ready signal is negated to gate the plurality of divided clocks so that the safe clocks are turned off and provided at a constant logic level zero, wherein at a point in time when the plurality of divided clocks are gated, each of the plurality of divided clocks are in its corresponding low state.

In yet another embodiment, an integrated circuit includes a plurality of chained flip flops configured to receive a root clock and configured to provide a plurality of generated clocks generated from the root clock, each flip flop having a corresponding data input and a corresponding inverse data output coupled to each other, a corresponding data output configured to provide a generated clock of the plurality of generated clocks, and a corresponding inverted clock input configured to receive one of the root clock or a corresponding generated clock of the plurality of generated clocks from a previous flip flop of the plurality of chained flip flops; clock gating circuitry configured to receive the plurality of generated clocks, provide the plurality of generated clocks as a corresponding plurality of safe clocks when the clock ready signal is asserted, and to provide a constant logic level zero as each of the plurality of safe clocks when the clock ready signal is negated; a delay circuit having an inverted clock input configured to receive a final generated clock from the plurality of generated clocks, wherein the final generated clock has a lowest frequency of the plurality of generated clocks, and configured to assert a trigger output a delay time after a falling edge of the final generated clock; and a set of synchronization flip flops configured to sample a value of a clock enable signal upon assertion of the trigger output of the delay circuit and configured to propagate the sampled value to an output of the set of synchronization flip flops as the clock enable clock ready indicator, wherein any state transition of the clock ready indicator is aligned with falling edges and not rising edges of the root clock and the plurality of generated clocks. In one aspect of this yet another embodiment, the integrated circuit further includes a set of flip flops corresponding to each of the plurality of safe clocks, wherein the set of flip flops are configured to provide a constant logic level zero as each of the plurality of safe clocks immediately upon the clock enable signal being negated. In another aspect, the delay circuit includes at least one of a counter configured to count falling edges of the final generated clock and assert the trigger output when a predetermined number of falling edges is counted, an amplitude estimator circuit configured to, in response to the falling edge of the final generated clock, estimate an amplitude of a clock signal and assert the trigger output when the amplitude is at least a predetermined threshold amplitude, and a duty cycle estimator circuit configured to, in response to the falling edge of the final generated clock, estimate a duty cycle of the root clock and assert the trigger output when the duty cycle is at least a predetermined threshold duty cycle.

The invention claimed is:

1. An integrated circuit comprising:
a plurality of chained clock dividers configured to receive a root clock and configured to provide a plurality of generated clocks generated from the root clock, each clock divider of the plurality of chained clock dividers provides a generated clock of the plurality of generated clocks having a lower frequency that its corresponding input clock and which transitions at falling edges of its corresponding input clock;
clock gating circuitry configured to receive the plurality of generated clocks and selectively gate the plurality of generated clocks based on a clock ready signal, wherein the clock gating circuitry is configured to provide the plurality of generated clocks as a corresponding plurality of safe clocks when the clock ready indicator indicates the plurality of generated clocks are ready;
a delay circuit having an inverted clock input configured to receive a final generated clock from the plurality of generated clocks and configured to provide a trigger output in response to a falling edge of the final generated clock; and
a set of synchronization flip flops configured to receive a clock enable signal and the trigger output from the delay circuit, and configured to provide the clock ready indicator based on the clock enable signal and the trigger output,
wherein the delay circuit asserts the trigger output by providing a rising edge at a delay time after the falling edge of the final generated clock, and the delay time is determined based on satisfying one or more conditions selected from a group of conditions consisting of a count of falling edges of the final generated clock, an estimated amplitude of a core clock, an estimated duty cycle of the root clock, a frequency of a selected clock.

2. The integrated circuit of claim 1, wherein each clock divider of the plurality of clock dividers comprises a D flip flop, each flip flop having a corresponding D input and corresponding inverse Q output coupled to each other.

3. The integrated circuit of claim 2, wherein each flip flop receives a corresponding input clock at a corresponding inverted clock input and provides a corresponding divided output clock at a corresponding Q output.

4. The integrated circuit of claim 2, wherein each flip flop provides the corresponding divided clock output at half a frequency of the corresponding input clock.

5. The integrated circuit of claim 2, wherein the plurality of chained clock dividers comprises:
a first flip flop having a corresponding inverted clock input configured to receive the root clock and a corresponding Q output configured to provide a first generated clock of the plurality of generated clocks to a corresponding inverted clock input of a subsequent flip flop and to the clock gating circuitry, and
a final flip flop having a corresponding inverted clock input configured to receive a corresponding generated clock from a corresponding Q output of a previous flip flop and having a corresponding Q output configured to provide the final generated clock.

6. The integrated circuit of claim 1, wherein the delay time is determined based on satisfying a logical combination of at least two conditions.

7. The integrated circuit of claim 1, wherein the delay circuit comprises at least one of:
  a counter configured to count the falling edges of the final generated clock and assert the trigger output when a predetermined number of falling edges is counted,
  an amplitude estimator circuit configured to, in response to the falling edge of the final generated clock, estimate an amplitude of a clock signal and assert the trigger output when the estimated amplitude is at least a predetermined threshold amplitude, and
  a duty cycle estimator circuit configured to, in response to the falling edge of the final generated clock, estimate a duty cycle of the root clock and assert the trigger output when the estimated duty cycle is at least a predetermined threshold duty cycle.

8. The integrated circuit of claim 1, wherein the delay time is determined based on the count of falling edges of the final generated clock reaching a predetermined number of falling edges of the final generated clock.

9. The integrated circuit of claim 1, wherein the delay time is determined based the estimated amplitude of the core clock reaching a predetermined threshold amplitude.

10. The integrated circuit of claim 1, wherein the delay time is determined based on the estimated duty cycle of the root clock reaching a predetermined threshold duty cycle.

11. An integrated circuit comprising:
  a plurality of chained clock dividers configured to receive a root clock and configured to provide a plurality of generated clocks generated from the root clock, each clock divider of the plurality of chained clock dividers provides a generated clock of the plurality of generated clocks having a lower frequency that its corresponding input clock and which transitions at falling edges of its corresponding input clock;
  clock gating circuitry configured to receive the plurality of generated clocks and selectively gate the plurality of generated clocks based on a clock ready signal, wherein the clock gating circuitry is configured to provide the plurality of generated clocks as a corresponding plurality of safe clocks when the clock ready indicator indicates the plurality of generated clocks are ready;
  a delay circuit having an inverted clock input configured to receive a final generated clock from the plurality of generated clocks and configured to provide a trigger output in response to a falling edge of the final generated clock; and
  a set of synchronization flip flops configured to receive a clock enable signal and the trigger output from the delay circuit, and configured to provide the clock ready indicator based on the clock enable signal and the trigger output,
  wherein the set of synchronization flip flops comprises:
    a first flip flop configured to receive the clock enable signal at a corresponding data input, a clock input configured to receive the trigger output from the delay circuit, and a corresponding data output, wherein the first flip flop is configured to sample a value of the enable signal in response to a rising edge of the trigger output,
    wherein the clock ready indicator is asserted to indicate that the plurality of generated clocks are ready in response to sampling an asserted value of the clock enable signal upon receiving a rising edge of the trigger output, and is negated in response to sampling a negated value of the clock enable signal upon receiving the rising edge of the trigger output.

12. The integrated circuit of claim 11, wherein the corresponding data output of the first flip flop is provided as the clock ready indicator.

13. The integrated circuit of claim 11, wherein the set of synchronization flip flops comprises:
  a second flip flop having a clock input configured to receive the trigger output from the delay circuit, a corresponding data input coupled to the corresponding data output of the first flip flop, and a corresponding data output is provided as the clock ready indicator.

14. The integrated circuit of claim 11, wherein the clock gating circuitry is configured to provide a constant logic level zero as each of the plurality of safe clocks while the clock ready indicator is negated to indicate clocks are not ready.

15. The integrated circuit of claim 11, wherein the root clock is started when either the clock enable signal is asserted or the clock ready indicator is asserted.

16. The integrated circuit of claim 11, further comprising a set of flip flops corresponding to each of the plurality of safe clocks, wherein the set of flip flops are configured to provide a constant logic level zero as each of the plurality of safe clocks immediately upon the clock enable signal being negated.

17. A method of controlling clocks in an integrated circuit, comprising:
  starting a root clock;
  generating a plurality of divided clocks based on the root clock, each having a different frequency, wherein the plurality of divided clocks includes a final divided clock with a lowest frequency of the plurality of divided clocks, and each of the plurality of divided clocks only transitions between high and low states with falling edges but not rising edges of those divided clocks of the plurality of divided clocks having a higher frequency;
  in response to a falling edge of the final divided clock, initiating a delay time, wherein the delay time is based on at least one of counting a number of falling edges of the final divided clock, estimating an amplitude of a selected clock, and estimating a duty cycle of the root clock;
  upon completion of the delay time, sampling a clock enable signal;
  providing a clock ready signal based on the sampled clock enable signal; and
  using the clock ready signal to selectively gate the plurality of divided clocks.

18. The method of claim 17, wherein:
  when the sampled clock enable signal indicates that clocks are enabled, the clock ready signal is asserted and the plurality of divided clocks are released as safe clocks upon assertion of the clock ready signal, wherein at a point in time when the plurality of divided clocks are released, each of the plurality of divided clocks are in its corresponding low state, and
  when the sampled clock enable signal indicates that clocks are not enabled, the clock ready signal is negated to gate the plurality of divided clocks so that the safe clocks are turned off and provided at a constant logic level zero, wherein at a point in time when the plurality of divided clocks are gated, each of the plurality of divided clocks are in its corresponding low state.

19. An integrated circuit comprising:
a plurality of chained flip flops configured to receive a root clock and configured to provide a plurality of generated clocks generated from the root clock, each flip flop having:
- a corresponding data input and a corresponding inverse data output coupled to each other,
- a corresponding data output configured to provide a generated clock of the plurality of generated clocks, and
- a corresponding inverted clock input configured to receive one of the root clock or a corresponding generated clock of the plurality of generated clocks from a previous flip flop of the plurality of chained flip flops;

clock gating circuitry configured to receive the plurality of generated clocks, provide the plurality of generated clocks as a corresponding plurality of safe clocks when the clock ready signal is asserted, and to provide a constant logic level zero as each of the plurality of safe clocks when the clock ready signal is negated;

a delay circuit having an inverted clock input configured to receive a final generated clock from the plurality of generated clocks, wherein the final generated clock has a lowest frequency of the plurality of generated clocks, and configured to assert a trigger output a delay time after a falling edge of the final generated clock;

a set of synchronization flip flops configured to sample a value of a clock enable signal upon assertion of the trigger output of the delay circuit and configured to propagate the sampled value to an output of the set of synchronization flip flops as the clock enable clock ready indicator, wherein any state transition of the clock ready indicator is aligned with falling edges and not rising edges of the root clock and the plurality of generated clocks; and a set of flip flops corresponding to each of the plurality of safe clocks, wherein the set of flip flops are configured to provide a constant logic level zero as each of the plurality of safe clocks immediately upon the clock enable signal being negated.

20. An integrated circuit, comprising:
a plurality of chained flip flops configured to receive a root clock and configured to provide a plurality of generated clocks generated from the root clock, each flip flop having:
- a corresponding data input and a corresponding inverse data output coupled to each other,
- a corresponding data output configured to provide a generated clock of the plurality of generated clocks, and
- a corresponding inverted clock input configured to receive one of the root clock or a corresponding generated clock of the plurality of generated clocks from a previous flip flop of the plurality of chained flip flops;

clock gating circuitry configured to receive the plurality of generated clocks, provide the plurality of generated clocks as a corresponding plurality of safe clocks when the clock ready signal is asserted, and to provide a constant logic level zero as each of the plurality of safe clocks when the clock ready signal is negated;

a delay circuit having an inverted clock input configured to receive a final generated clock from the plurality of generated clocks, wherein the final generated clock has a lowest frequency of the plurality of generated clocks, and configured to assert a trigger output a delay time after a falling edge of the final generated clock; and a set of synchronization flip flops configured to sample a value of a clock enable signal upon assertion of the trigger output of the delay circuit and configured to propagate the sampled value to an output of the set of synchronization flip flops as the clock enable clock ready indicator, wherein any state transition of the clock ready indicator is aligned with falling edges and not rising edges of the root clock and the plurality of generated clocks, wherein the delay circuit comprises at least one of:
- a counter configured to count falling edges of the final generated clock and assert the trigger output when a predetermined number of falling edges is counted,
- an amplitude estimator circuit configured to, in response to the falling edge of the final generated clock, estimate an amplitude of a clock signal and assert the trigger output when the amplitude is at least a predetermined threshold amplitude, and
- a duty cycle estimator circuit configured to, in response to the falling edge of the final generated clock, estimate a duty cycle of the root clock and assert the trigger output when the duty cycle is at least a predetermined threshold duty cycle.

* * * * *